(12) United States Patent
Sasaki et al.

(10) Patent No.: US 9,412,582 B2
(45) Date of Patent: Aug. 9, 2016

(54) REACTION TUBE, SUBSTRATE PROCESSING APPARATUS, AND METHOD OF MANUFACTURING SEMICONDUCTOR DEVICE

(71) Applicant: HITACHI KOKUSAI ELECTRIC INC., Tokyo (JP)

(72) Inventors: Takafumi Sasaki, Toyama (JP); Kazuhiro Morimitsu, Toyama (JP); Eisuke Nishitani, Toyama (JP); Tetsuo Yamamoto, Toyama (JP); Masanao Fukuda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/665,781

(22) Filed: Mar. 23, 2015

(65) Prior Publication Data
US 2015/0270125 A1 Sep. 24, 2015

(30) Foreign Application Priority Data

Mar. 24, 2014 (JP) ................................. 2014-060039

(51) Int. Cl.
*H01L 21/46* (2006.01)
*H01L 21/02* (2006.01)
*C23C 16/458* (2006.01)
*C23C 16/455* (2006.01)

(52) U.S. Cl.
CPC ...... *H01L 21/02186* (2013.01); *C23C 16/4584* (2013.01); *C23C 16/4585* (2013.01); *H01L 21/0234* (2013.01); *H01L 21/02274* (2013.01); *H01L 21/02329* (2013.01); *C23C 16/455* (2013.01)

(58) Field of Classification Search
CPC ............... C23C 16/45544; C23C 16/45546; C23C 16/4412; C23C 16/455; C23C 16/45587; C23C 16/45591; H01L 21/67011
See application file for complete search history.

(56) References Cited

U.S. PATENT DOCUMENTS

| 2012/0190215 A1* | 7/2012 | Ikeuchi ............. H01L 21/02164 438/790 |
| 2012/0199067 A1 | 8/2012 | Morozumi et al. |
| 2013/0252439 A1 | 9/2013 | Hirose et al. |
| 2014/0174352 A1* | 6/2014 | Joo ........................ C23C 16/34 118/715 |

FOREIGN PATENT DOCUMENTS

| JP | 2010-258265 A | 11/2010 |
| JP | 4645616 B2 | 3/2011 |
| JP | 2012-169307 A | 9/2012 |
| JP | 2013-225660 A | 10/2013 |

* cited by examiner

*Primary Examiner* — Selim Ahmed
*Assistant Examiner* — Evan Clinton
(74) *Attorney, Agent, or Firm* — Volpe and Koenig, P.C.

(57) ABSTRACT

A structure for constituting a process chamber in which a plurality of substrates is processed by reacting a predetermined precursor gas therein includes an outer tube having a cylindrical shape with an upper end portion closed and a lower end portion opened, and an inner tube, installed within the outer tube, including a first exhaust slit and a second exhaust slit through which the predetermined precursor gas is exhausted, the first exhaust slit located in a substrate arrangement region in which the plurality of substrates are arranged, and the second exhaust slit located in a region lower than the substrate arrangement region.

14 Claims, 9 Drawing Sheets

REACTION TUBE, SUBSTRATE PROCESSING APPARATUS, AND METHOD OF MANUFACTURING SEMICONDUCTOR DEVICE

CROSS-REFERENCE TO RELATED APPLICATION

This application is based upon and claims the benefit of priority from Japanese Patent Application No. 2014-060039, filed on Mar. 24, 2014, the entire contents of which are incorporated herein by reference.

TECHNICAL FIELD

The present disclosure relates to a method of manufacturing a semiconductor device and a substrate processing apparatus, and in particular, to a reaction tube for forming a metal film on a substrate (wafer), a substrate processing apparatus, and a method of manufacturing a semiconductor device.

BACKGROUND

Among substrate processing apparatuses for manufacturing semiconductor devices, there is a batch-type vertical substrate processing apparatus for stacking and processing a plurality of semiconductor wafers as substrates therein. In general, the batch-type vertical substrate processing apparatus is configured such that a certain number of wafers are sustained as a plurality of layers in a boat serving as a substrate sustaining member at a predetermined interval (wafer stacking interval pitch). Further, the boat sustaining wafers is typically loaded to or unloaded from a reaction tube for constituting a reaction chamber so as to perform a substrate processing process. If the ratio of a distance (gap) between outer edges of wafers and an inner wall of the reaction tube to the wafer stacking interval pitch is relatively large, raw material may not positively flow onto the wafers. Thus, the raw material is unnecessarily wasted which in turn increases costs for film formation. Further, such problem may get worse as the diameter of substrates increases as in recent years.

In an effort to solve the problem, a plurality of solutions is presented. However, some of the solutions are simply related to a technique of preventing an increase in costs for film formation by controlling a supply flow rate of a gas by means of a controller, without considering the problems of the apparatus configuration described above.

Further, a vertical substrate processing apparatus needs gas to be supplied (or gas replacement) or vacuum evacuation more quickly.

SUMMARY

The present disclosure provides some embodiments of a structure capable of increasing efficiency of gas supply.

According to one embodiment of the present disclosure, there is provided a structure for constituting a process chamber in which a plurality of substrates is processed by reacting a predetermined precursor gas therein, including: an outer tube having a cylindrical shape with an upper end portion closed and a lower end portion opened; and an inner tube, installed within the outer tube, including a first exhaust slit and a second exhaust slit through which the predetermined precursor gas is exhausted, the first exhaust slit located in a substrate arrangement region in which the plurality of substrates are arranged, and the second exhaust slit located in a region lower than the substrate arrangement region.

DETAILED DESCRIPTION

Figure 8:
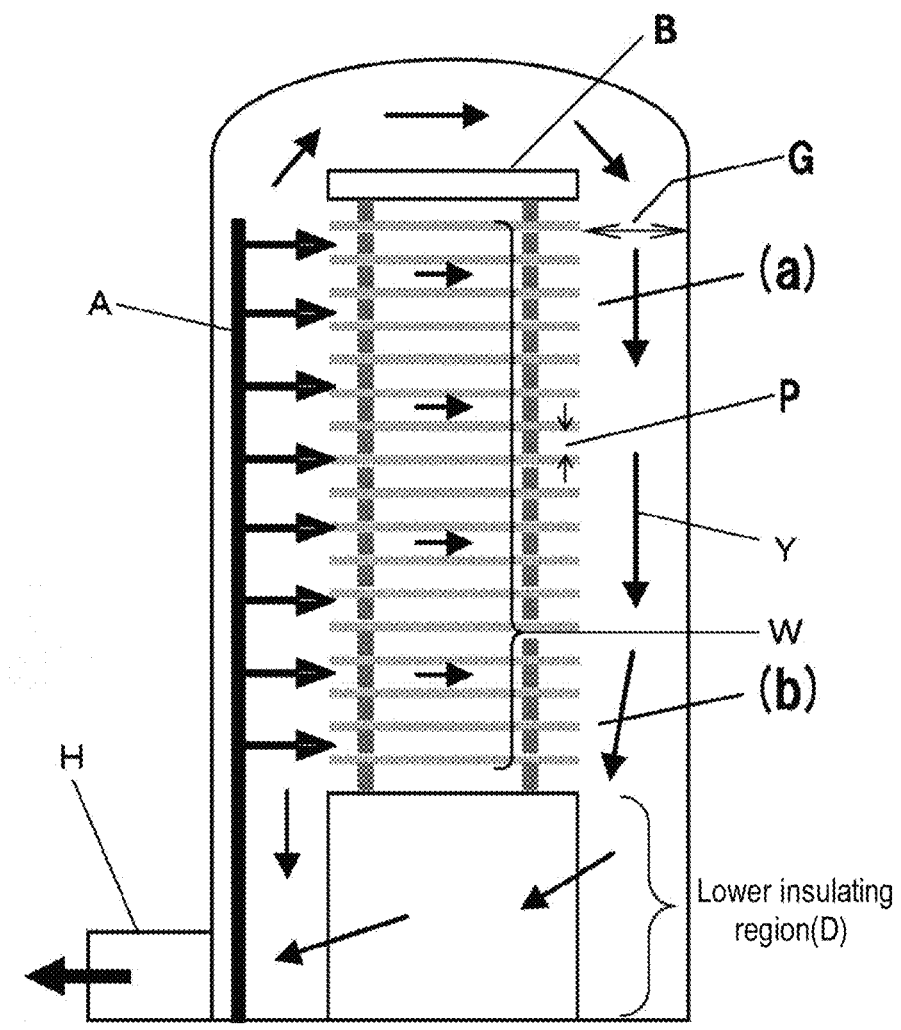
FIG. 8 is a schematic view illustrating a batch-type vertical substrate processing apparatus.

A batch-type vertical substrate processing apparatus as a substrate processing apparatus will be described with reference to FIG. 8. A reaction furnace includes a reaction tube and a boat B as a substrate sustaining member is inserted into a reaction chamber (process chamber) formed by the reaction tube. The boat B is configured to allow a plurality of semiconductor wafers (silicon wafers) as substrates to be sustained in multiple layers with a gap (substrate pitch gap) P in a substantially horizontal state. Further, a distance between circumferential portions of the semiconductor wafers and an inner wall of the reaction tube is denoted by a gap G. In FIG. 8, a plurality of gas supply nozzles are denoted by A, a flow of a gas is denoted by arrow Y, a region in which the wafers are sustained is denoted by W, an insulating region below the region W is denoted by D, and a gas exhaust pipe is denoted by H. In the reaction furnace having a single tube structure (e.g., precursor gas are horizontally discharged and then downwardly exhausted, see FIG. 8), a ratio (G/P) of the gap G as a distance between the outer edges of the wafers and the inner wall of the reaction tube to the wafer stacking interval pitch P is so large that a precursor gas cannot be positively delivered onto the wafers, and thus, the precursor gas may be unnecessarily used. Further, in the reaction furnace having the single tube structure, among the plurality of wafers disposed as a plurality of layers, films formed on the wafers on a lower side (b) have morphology (film quality) that is inferior to those formed on the wafers on an upper side (a). Furthermore, the films formed on the wafers on the lower side (b) tend to have a higher sheet resistance value Rs, and thus, an in-plane uniformity of the wafers in film thickness is low. In contrast, in a precursor gas supply process, by finely repeating supply of a precursor gas into the reaction chamber and evacuation, film quality is improved and the difference between the upper and lower sheet resistance values Rs of the wafers disposed as the plurality of layers are also decreased. Based on this, the following mechanism may be presumed.

That is, when a precursor gas is supplied, a byproduct may be generated on the wafers simultaneously. In the reaction furnace having a single tube structure, if the evacuation is not performed in the interim between supplying the precursor gas, since a concentration of the byproduct increases from an upper end to a lower end of the wafers disposed as the plurality of layers, film quality is degraded in the vicinity of the lower end and the sheet resistance value Rs also increases in the vicinity of the lower end. When evacuation is performed in the interim between supplying the precursor gas, vertical morphology and sheet resistance value Rs distribution are improved, and thus, the byproduct has an influence.

<One Embodiment of the Present Disclosure>

Hereinafter, one embodiment of the present disclosure will be described.

(1) Configuration of Substrate Processing Apparatus

Figure 1:
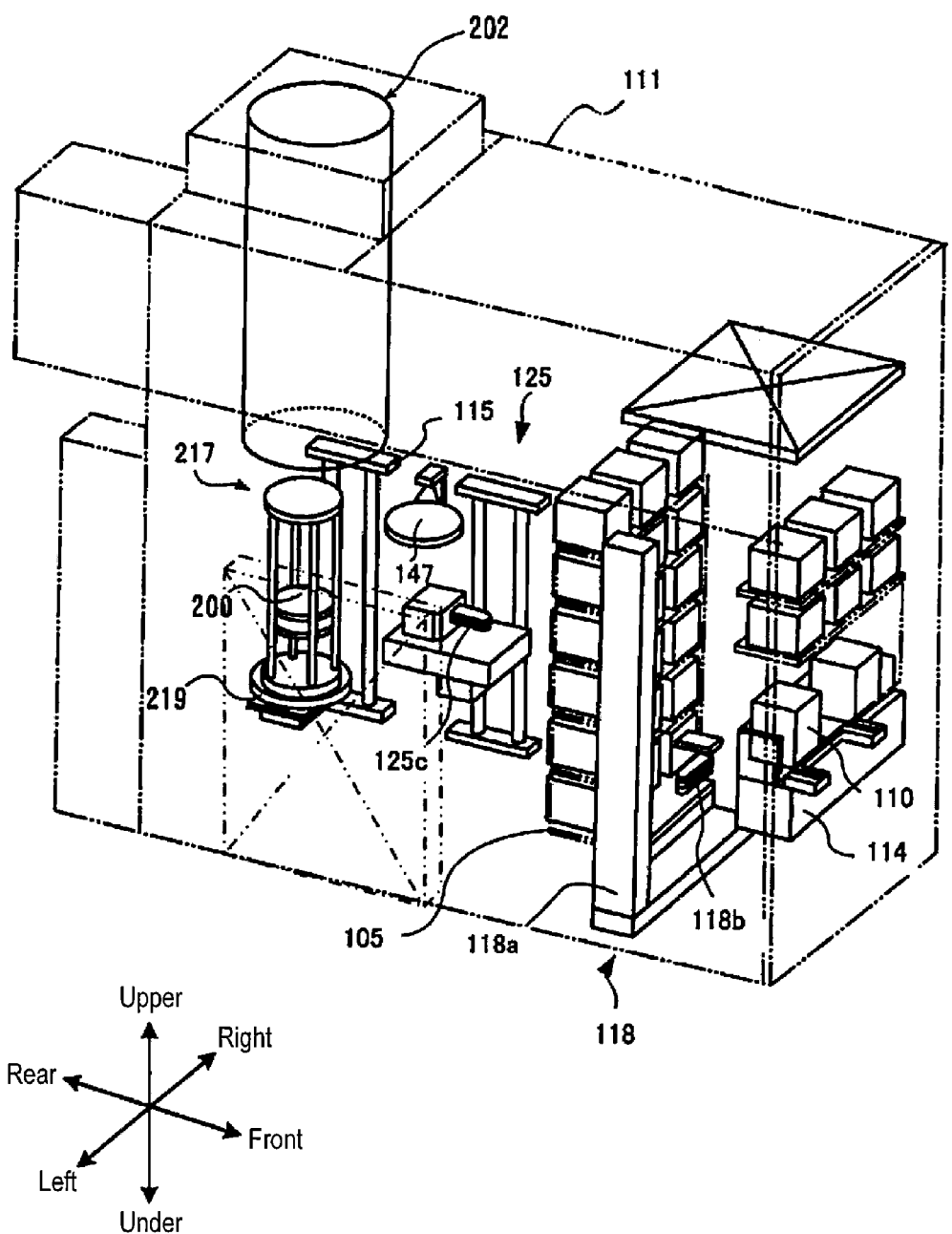
FIG. 1 is a schematic configuration view of a substrate processing apparatus according to an embodiment of the present disclosure.
Figure 2:
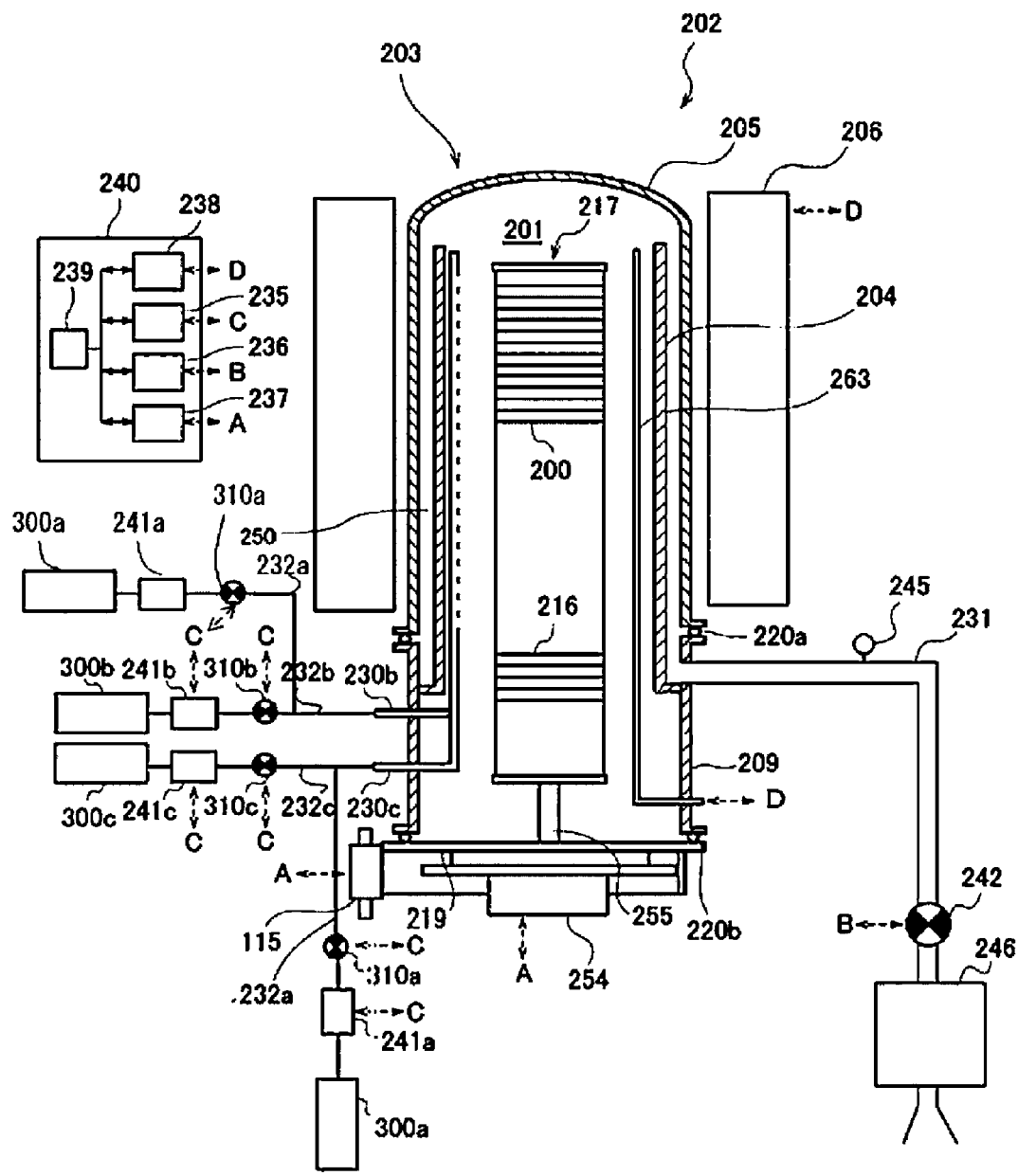
FIG. 2 is a lateral cross-sectional view of a processing furnace according to an embodiment of the present disclosure.

A configuration of a substrate processing apparatus 101 according to the present embodiment will be described with reference to FIGS. 1 and 2. FIG. 1 is a schematic configuration view of the substrate processing apparatus 101 according to one embodiment of the present disclosure. FIG. 2 is a lateral cross-sectional view of a processing furnace 202 according to one embodiment of the present disclosure. Further, the substrate processing apparatus 101 according to the present embodiment is configured as, for example, a vertical apparatus for performing oxidation processing, diffusion processing, thin film formation processing, and the like on substrates such as wafers.

(Overall Configuration)

As illustrated in FIG. 1, the substrate processing apparatus 101 is configured as a batch-type vertical thermal processing apparatus. The substrate processing apparatus 101 includes a housing 111 in which a plurality of components such as the processing furnace 202 is installed. A pod (also referred to as "FOUP") 110 is used as a container (wafer carrier) for transferring substrates into the housing 111. The pod 110 is configured to receive, for example, 25 sheets of wafers (substrates) 200 formed of silicon (Si), silicon carbide (SiC), or the like. A pod stage 114 is disposed on a front side of the housing 111. The pod 110 closed with a cover is configured to be loaded on the pod stage 114.

A pod transfer device 118 is installed in a position facing the pod stage 114 on the front side (right side of FIG. 1) within the housing 111. In the vicinity of the pod transfer device 118, a pod loading shelf 105, a pod opener (not shown), and a wafer number detector (not shown) are installed. The pod loading shelf 105 is disposed above the pod opener and configured to sustain a plurality of pods 110 in a loaded state. The wafer number detector is installed to be adjacent to the pod opener. The pod transfer device 118 includes a pod elevator 118a which can be lifted and lowered with pods sustained therein and a pod transfer mechanism 118b as a transfer mechanism. The pod transfer device 118 is configured to transfer the pod 110 among the pod stage 114, the pod loading shelf 105, and the pod opener through continuous operations of the pod elevator 118a and the pod transfer mechanism 118b. The pod opener is configured to open a cover of the pod 110. The wafer number detector is configured to detect the number of wafers 200 within the pod 110 with the cover thereof opened.

A wafer transfer unit 125 and a boat 217 as a substrate sustaining member are installed within the housing 111. The wafer transfer unit 125 has an arm (pincette) 125c and has a structure capable of ascending and descending in a vertical direction and rotating in a horizontal direction by a driving unit (not shown). The arm 125c is configured to extract, for example, five sheets of wafers at a time. As the arm 125c is moved, it is configured such that the wafers 200 are transferred between the pod 110 placed in the position of the pod opener and the boat 217.

Next, an operation of the substrate processing apparatus 101 according to the present embodiment will be described.

First, the pod 110 is loaded on the pod stage 114 by a transfer device (not shown) in the process such that the wafers 200 are erected and a wafer entrance of the pod 110 faces in an upward direction. Thereafter, the pod 110 is rotated by 90° in a vertical direction toward the rear of the housing 111 by the pod stage 114. As a result, the wafer 200 within the pod 110 is horizontally placed and the wafer entrance of the pod 110 faces the rear side of the housing 111.

Subsequently, the pod 110 is automatically delivered to a designated shelf position of the pod loading shelf 105 by the pod transfer device 118 and temporarily kept in storage. Thereafter, the pod 110 is moved from the pod loading shelf 105 and loaded to the pod opener, or directly transferred to the pod opener.

When the pod 110 is moved and loaded on the pod opener, the cover of the pod 110 may be opened by the pod opener. And then, the number of wafers within the pod 110 with the cover thereof opened is detected. The wafer 200 is picked up from the interior of the pod 110 through the wafer entrance by the arm 125c of the wafer transfer unit 125 and charged in the boat 217 through a transfer operation of the wafer transfer unit 125. After delivering the wafer 200 to the boat 217, the wafer transfer unit 125 is returned to the pod 110 and charges a next wafer 200 to the boat 217.

When a predesignated number of wafers 200 are charged in the boat 217, a lower end portion of the processing furnace 202 which has been closed by a furnace opening shutter (not shown) is opened by the furnace opening shutter. Subsequently, a seal cap 219 is lifted by a boat elevator 115 (see FIG. 2), and thus, the boat 217 sustaining the wafers 200 in a group is loaded into the processing furnace 202 (boat loading). After the loading, a certain processing is performed on the wafers 200 in the processing furnace 202. The related processing will be described later. After the processing, the wafers 200 and the boat 217 are unloaded from the processing furnace 202 (boat unloading), and the wafers 200 are discharged from the boat 217 in reverse order of the foregoing order (discharging) so as to be unloaded out from the housing 111.

(Configuration of Processing Furnace)

Hereinafter, a configuration of the processing furnace 202 according to the present embodiment will be described with reference to FIG. 2.

(Process Chamber)

As illustrated in FIG. 2, the processing furnace 202 includes a process tube 203 as a reaction tube. The process tube 203 includes an inner tube 204 as an internal reaction tube and an outer tube 205 as an external reaction tube installed on an outer side of the inner tube 204. The inner tube 204 is formed of a heat resistant material such as, for example, quartz ($SiO_2$) or silicon carbide (SiC). The inner tube 204 is formed to have a cylindrical shape with an upper end portion and a lower end portion opened. A process chamber 201 is formed in a container hollow portion within the inner tube 204 to perform a process of forming thin films on the wafers 200 as substrates. The process chamber 201 is configured to accommodate the wafers 200 in an aligned state of being horizontally sustained in multiple layers along a vertical direction by a boat 217. The outer tube 205 has a concentric circle shape with the inner tube 204. The outer tube 205 has an inner diameter greater than an outer diameter of the inner tube 204 and is formed to have a cylindrical shape with the upper end portion closed and the lower end portion opened. The outer tube 205 is also formed of a heat resistant material such as, for example, quartz or silicon carbide.

(Heater)

A heater 206 as a heating portion has a concentric circle shape surrounding a side wall surface of the process tube 203 and is installed on an outer side of the process tube 203. The heater 206 is formed to have a cylindrical shape. The heater 206 is supported by a heater base as a support plate (not shown) so as to be installed vertically. A temperature sensor 263 is installed as a temperature detector within the process tube 203 (for example, between the inner tube 204 and the outer tube 205, within the inner tube 204, or the like). A temperature control unit 238, which will be described later, is electrically connected to the heater 206 and the temperature sensor 263. The temperature control unit 238 may control a state of conduction to the heater 206 based on the temperature information detected by the temperature sensor 263 such that an internal temperature of the process chamber 201 has a predetermined temperature distribution at a predetermined timing.

(Manifold)

A manifold 209 having a concentric circle shape with the outer tube 205 is disposed below the outer tube 205. The manifold 209 is formed of, for example, stainless steel, or the like. The manifold 209 is formed to have a cylindrical shape with the upper and lower end portions opened. The manifold 209 is installed to be engaged to each of the lower end portion of the inner tube 204 and the lower end portion of the outer tube 205 or installed to support each of the lower end portion of the inner tube 204 and the lower end portion of the outer tube 205. Further, an O-ring 220a as a seal member is installed between the manifold 209 and the outer tube 205. Since the manifold 209 is supported by the heater base (not shown), the process tube 203 is installed vertically. A reaction container is formed by the process tube 203 and the manifold 209.

(Boat)

The boat 217 as a substrate sustaining member is configured within the process chamber 201 to be loaded from a lower side of opening of the lower end portion of the manifold 209. The boat 217 is configured to align a plurality of wafers 200 as substrates in the center thereof so as to be horizontally oriented and arranged and sustained at certain intervals. The boat 217 is formed of a heat resistant material such as, for example, quartz or silicon carbide. A plurality of sheets of insulating plates 216 as insulating members having a disk shape are disposed below the boat 217 and below a wafer processing region to be horizontally oriented in multiple layers. The insulating plates 216 are formed of a heat resistant material such as, for example, quartz or silicon carbide. The insulating plates 216 are configured to make it difficult for heat to be transferred from the heater 206 to the manifold 209.

(Carrier Gas Supply System)

A nozzle 230b and a nozzle 230c for supplying, for example, a nitrogen ($N_2$) gas as a carrier gas into the process chamber 201 are installed on a side wall of the manifold 209 and communicate with the interior of the process chamber 201. The nozzle 230b and the nozzle 230c are formed of, for example, quartz, or the like. At least one nozzle 230b and at least one nozzle 230c are installed, and extend in a direction in which the wafers 200 are loaded along the inner wall of the process tube 203, in a space having a circular arc shape between the inner wall of the process tube 203 and the wafers 200. A plurality of gas supply holes, allowing a gas to be supplied therethrough, is formed on the lateral surfaces of the nozzle 230b and the nozzle 230c. The gas supply holes may be formed to have openings identical from a lower portion to an upper portion, or openings gradually varied in opening areas. Further, the gas supply holes may be formed at the same opening pitches. Upper stream end portions of the nozzle 230b and the nozzle 230c are connected to a lower stream end portion of a carrier gas supply pipe 232a. In the carrier gas supply pipe 232a, a carrier gas source 300a, a mass flow controller 241a as a flow rate controller (flow rate control unit), and a valve 310a are installed in this order from an upper stream side. With this configuration, a supply flow rate of a carrier gas supplied into the process chamber 201 through the carrier gas supply pipe 232a, a concentration or partial pressure of the carrier gas within the process chamber 201 may be controlled.

A gas flow rate control unit 235, which will be described later, is electrically connected to the valve 310a and the mass flow controller 241a. The gas flow rate control unit 235 is configured to control initiating or stopping of carrier gas supply into the process chamber 201, a supply flow rate of the carrier gas, or the like at a predetermined timing.

The carrier gas supply system according to the present embodiment is configured by the valve 310a, the mass flow controller 241a, the carrier gas supply pipe 232a, and the nozzle 230b. Further, the carrier gas source 300a may also be included in the carrier gas supply system.

(Ti Precursor Gas Supply System)

The nozzle 230b for supplying a precursor gas (metal-containing gas), for example, Ti precursor (T-4)-titanium chloride ($TiCl_4$), tetrakis-dimethyl amino-titanium (TDMAT, $Ti[N(CH_3)_2]_4$), or tetrakis-diethyl amino-titanium (TDEAT, $Ti[N(CH_2CH_3)_2]_4$) into the process chamber 201 is installed on the side wall of the manifold 209 such that it communicates with the interior of the process chamber 201. The nozzle 230b is formed of, for example, quartz, or the like. At least one nozzle 230b is installed, and extends in a direction in which the wafers 200 are loaded along the inner wall of the process tube 203, in a space having a circular arc shape between the inner wall of the process tube 203 and the wafers 200. A plurality of gas supply holes, allowing a gas to be supplied therethrough, is formed on the lateral surface of the nozzle 230b. The gas supply holes may be formed to have openings identical from a lower portion to an upper portion, or openings gradually varied in opening areas. Further, the gas supply holes may be formed at the same opening pitches. An upper stream end portion of the nozzle 230b is connected to a lower stream end portion of a gas supply pipe 232b. In the gas supply pipe 232b, a Ti precursor gas source 300b, a mass flow controller 241b as a flow rate controller (flow rate control unit), and a valve 310b are installed in this order from the upper stream side. With this configuration, a supply flow rate of a Ti precursor gas supplied into the process chamber 201 and a concentration or partial pressure of the Ti precursor gas within the process chamber 201 may be controlled.

The gas flow rate control unit 235, which will be described later, is electrically connected to the valve 310b and the mass flow controller 241b. The gas flow rate control unit 235 is configured to control initiating or stopping of Ti precursor gas supply into the process chamber 201, a supply flow rate of the Ti precursor gas, or the like at a predetermined timing.

The Ti precursor gas supply system according to the present embodiment is configured by the valve 310b, the mass flow controller 241b, the gas supply pipe 232b, and the nozzle 230b. Further, the Ti precursor gas source 300b may also be included in the Ti precursor gas supply system.

(Nitriding Precursor Gas Supply System)

A nozzle 230c for supplying a gas such as ammonia ($NH_3$), nitrogen ($N_2$), nitrous oxide ($N_2O$), or monomethyl hydrazine ($CH_6N_2$) as a nitriding precursor, as an example of a modification precursor (a reaction gas or a reactant) into the process chamber 201 is installed on the side wall of the manifold 209 such that it communicates with the interior of the process chamber 201. The nozzle 230c is formed of, for example, quartz, or the like. At least one nozzle 230c is installed, and extends in a direction in which the wafers 200 are loaded along the inner wall of the process tube 203, in a space having a circular arc shape between the inner wall of the process tube 203 and the wafers 200. A plurality of gas supply holes, allowing a gas to be supplied therethrough, is formed on the lateral surface of the nozzle 230c. The gas supply holes may be formed to have openings identical from a lower portion to an upper portion, or openings gradually varied in opening areas. Further, the gas supply holes may be formed at the same opening pitches. An upper stream end portion of the nozzle 230c is connected to a lower stream end portion of a gas supply pipe 232c. In the gas supply pipe 232c, a nitrogen inert gas source 300c, a mass flow controller 241c as a flow rate controller (flow rate control unit), and a valve 310c are installed in this order from the upper stream side. With this configuration, a supply flow rate of a nitrogen gas supplied into the process chamber 201 and a concentration or partial pressure of the nitrogen gas within the process chamber 201 may be controlled.

The gas flow rate control unit 235, which will be described later, is electrically connected to the valve 310c and the mass flow controller 241c. The gas flow rate control unit 235 is configured to control initiating or stopping of inert gas supply into the process chamber 201, a supply flow rate of the inert gas, or the like at a predetermined timing.

The nitriding precursor gas supply system according to the present embodiment is configured by the valve 310c, the mass flow controller 241c, the gas supply pipe 232c, and the nozzle 230c. Further, the nitrogen precursor gas source 300c may also be included in the nitrogen precursor gas supply system.

Also, the gas supply system according to the present embodiment is configured mainly by the Ti precursor gas supply system, the nitriding precursor gas supply system, and the carrier gas supply system.

(Exhaust System)

An exhaust pipe 231 is installed on a side wall of the manifold 209 to exhaust air from the interior of the process chamber 201. The exhaust pipe 231 penetrates through a lateral portion of the manifold 209, and communicates with a lower end portion of a container-shaped space 250 formed by a gap between the inner tube 204 and the outer tube 205. In a lower stream side of the exhaust pipe 231 (opposing the connection side with the manifold 209), a pressure sensor 245 as a pressure detector, an auto pressure controller (APC) valve 242 as a pressure adjusting device, and a vacuum pump 246 are installed in this order from the upper stream side.

A pressure control unit 236 described later is electrically connected to the pressure sensor 245 and the APC valve 242. The pressure control unit 236 is configured to control a degree of opening of the APC valve 242 based on pressure information detected by the pressure sensor 245 such that the internal pressure of the process chamber 201 has a predetermined pressure (degree of vacuum) at a predetermined timing. Further, the APC valve 242 may be configured as an opening and closing valve that may be opened and closed to perform or stop evacuation within the process chamber 201 and may also adjust a degree of opening thereof to adjust the internal pressure of the process chamber 201.

The exhaust system according to the present embodiment is configured by the exhaust pipe 231, the pressure sensor 245, and the APC valve 242. In addition, the vacuum pump 246 may be included in the exhaust system, and further, a trap device or a harm removing device may be included in the exhaust system.

(Seal Cap)

A seal cap 219 is installed as a furnace opening cover capable of tightly closing the reaction container in the opening of a lower end portion of the manifold 209. The seal cap 219 is formed of a metal such as stainless steel and has a disk shape. An O-ring 220b is installed as a seal member contacting the lower end portion of the manifold 209 on an upper surface of the seal cap 219. The seal cap 219 is configured to be brought into contact with the lower end portion of the manifold 209 from a lower side of the reaction container in a vertical direction.

(Rotary Mechanism)

A rotary mechanism 254 for rotating the boat 217 is installed in the lower side (opposing the process chamber 201) of the seal cap 219. A rotational shaft 255 of the rotary mechanism 254 is installed to penetrate through the seal cap 219. An upper end portion of the rotational shaft 255 supports the boat 217 upwardly. By operating the rotary mechanism 254, the boat 217 and the wafers 200 may be configured to be rotated within the process chamber 201. Further, an inert gas is allowed to flow in the vicinity of the rotational shaft 255 in order to make it difficult for the rotational shaft 255 to be affected by a process gas, thus protecting the rotational shaft 255 from the process gas.

(Boat Elevator)

The seal cap 219 is configured to be lifted or lowered in a vertical direction by the boat elevator 115 as a lifting mechanism vertically installed outside of the process tube 203. By operating the boat elevator 115, the boat 217 may be loaded into or unloaded from the process chamber 201 (boat loading or unloading).

A driving control unit 237 is electrically connected to the rotary mechanism 254 and the boat elevator 115. The driving control unit 237 is configured to control the rotary mechanism 254 and the boat elevator 115 to perform a predetermined operation at a predetermined timing.

(Controller)

The gas flow rate control unit 235, the pressure control unit 236, the driving control unit 237, and the temperature control unit 238 described above are electrically connected to the main control unit 239 configured to control the entire part of the substrate processing apparatus 101. A controller 240 is configured as a control unit according to the present embodiment by the gas flow rate control unit 235, the pressure control unit 236, the driving control unit 237, the temperature control unit 238, and the main control unit 239.

The controller 240 is an example of a control unit for controlling the entire operation of the substrate processing apparatus 101, and configured to control adjustment of a flow rate of the mass flow controllers 241a, 241b, and 241c, an opening and closing operation of the valves 310a, 310b, and 310c, an operation of adjusting a pressure based on opening and closing of the APC valve 242 and the pressure sensor 245, an operation of adjusting a temperature of the heater 206 based on the temperature sensor 263, actuation and stopping of the vacuum pump 246, adjusting a rotational speed of the rotary mechanism 254, an operation of lifting and lowering the boat elevator 115, and the like.

Hereinafter, the reaction tube according to some embodiments of the present disclosure will be described with reference to the drawings.

<Method of Manufacturing Semiconductor Device>

Next, a method of forming an insulating film on a substrate in manufacturing large scale integration (LSI) circuits, or the like will be exemplarily described. Some embodiments may be described as one of the processes of manufacturing a semiconductor device by using the processing furnace 202 of the substrate processing apparatus described above. Further, in the following description, operations of the respective components constituting the substrate processing apparatus may be controlled by the controller 240.

[First Embodiment]

In this embodiment, a method of forming a titanium nitride (TiN) film as a metal film on a substrate will be described.

First, a precursor gas and a reaction gas are alternately supplied to form a TiN film on the substrate.

In this embodiment, an example in which $TiCl_4$ is used as a titanium-containing precursor and $NH_3$ is used as a nitriding gas will be described. Further, in this example, a titanium-containing gas supply system (a first element-containing gas supply system) is configured by a first gas supply system, and a nitrogen-containing gas supply system (a second element-containing gas supply system) is configured by a second gas supply system.

Figure 3:
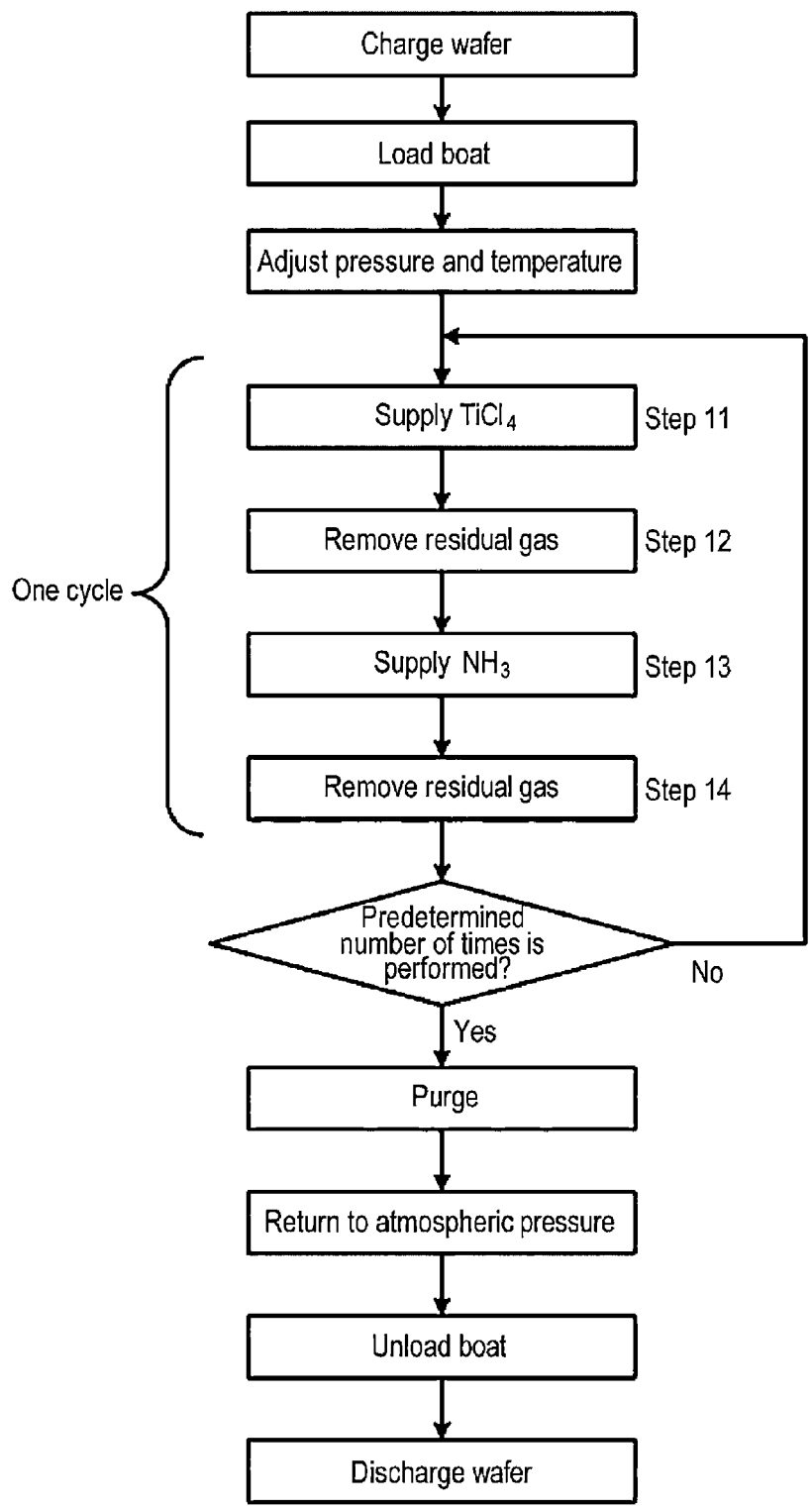
FIG. 3 is a view illustrating a control flow according to an embodiment of the present disclosure.

FIG. 3 is a view illustrating an example of a control flow according to an embodiment in the present embodiment.

First, when a plurality of wafers 200 are charged in the boat 217 (wafer charging), the boat 217 that supports the plurality of wafers 200 are lifted by the boat elevator 115 and loaded into the process chamber 201 (boat loading). In this state, the seal cap 219 seals the lower end portion of the process tube 203 with the O-ring 220b interposed therebetween. Further, in the film formation process, the controller 240 controls the substrate processing apparatus 101. For example, the controller 240 controls the heater 206 to maintain the internal temperature of the process chamber 201 within a range of, e.g., 300 to 550 degrees C., specifically to a temperature equal to or smaller than 450 degrees C., more specifically at 450 degrees C. Thereafter, the controller 240 charges the plurality of wafers 200 to the boat 217 and loads the boat 217 into the process chamber 201. And then, the controller 240 rotates the boat 217 by means of the rotary mechanism 254 to rotate the wafers 200. Thereafter, the controller 240 operates the vacuum pump 246 and also opens the APC valve 242 to vacuumize the interior of the process chamber 201. When the temperature of the wafers 200 reaches 450 degrees C. so as to be stabilized, the controller 240 sequentially performs the following steps, in a state in which the internal temperature of the process chamber 201 is maintained at 450 degrees C.

(Step 11)

In step 11, $TiCl_4$ is allowed to flow (or supplied). $TiCl_4$ is a liquid under room temperature, and in order to supply $TiCl_4$ to the process chamber 201, a method of heating $TiCl_4$ to vaporize $TiCl_4$ and then supplying $TiCl_4$, a method of making an inert gas such as helium (He), neon (Ne), argon (Ar), or nitrogen ($N_2$), which is called a carrier gas, pass through a $TiCl_4$ container by using a carburetor (not shown), and supplying a vaporized portion of $TiCl_4$ together with the carrier gas to the process chamber 201, or the like may be used. In this embodiment, the latter case will be described as an example.

$TiCl_4$ is allowed to flow through the gas supply pipe 232b, and a carrier gas ($N_2$) is allowed to flow through the carrier gas supply pipe 232a connected to the gas supply pipe 232b. All of the valve 310b of the gas supply pipe 232b, the valve 310a of the carrier gas supply pipe 232a connected to the nozzle 230b, and the APC valve 242 of the exhaust pipe 231 are opened. The carrier gas flows from the carrier gas supply pipe 232a and a flow rate thereof is adjusted by the mass flow controller 241a. $TiCl_4$ flows from the gas supply pipe 232b and a flow rate thereof is adjusted by the mass flow controller 241b. The flow rate-adjusted $TiCl_4$ is vaporized by a carburetor (not shown) and mixed with the flow rate-adjusted carrier gas. The $TiCl_4$ mixed with the carrier gas is supplied into the process chamber 201 from a gas supply hole of the nozzle 230b while being exhausted from the exhaust pipe 231. At this time, the APC valve 242 may be appropriately adjusted to maintain the internal pressure of the process chamber 201 within a range of 20 to 50 Pa, e.g., at 30 Pa. A supply flow rate of $TiCl_4$ controlled by the mass flow controller 241b ranges from 1.0 to 2.0 g/min. A duration in which the wafer 200 is exposed to $TiCl_4$ is 3 to 10 seconds. At this time, a temperature of the heater 206 ranges from 300 to 550 degrees C., and is set to e.g., 450 degrees C.

At this point, a gas flowing into the process chamber 201 is only $TiCl_4$ and an inert gas such as $N_2$ or Ar, and $NH_3$ is not present. Thus, $TiCl_4$, rather than causing a vapor reaction, is surface-reacted with a surface or a base film of each wafer 200 (chemical adsorption) to form an adsorption layer of the precursor ($TiCl_4$) or a Ti layer (hereinafter, referred to as a "Ti-containing layer"). The adsorption layer of $TiCl_4$ includes a discontinuous adsorption layer as well as a continuous adsorption layer of precursor molecules. The Ti layer also includes a Ti thin film formed as Ti layers overlap with each other, as well as continuous layers formed of Ti. Also, continuous layers formed of Ti may also be referred to as a Ti thin film.

Simultaneously, when the valve 310a is opened to flow an inert gas from the carrier gas supply pipe 232a connected in the middle of the gas supply pipe 232c, $TiCl_4$ can be prevented from flowing toward the $NH_3$ side.

(Step 12)

The valve 310b of the gas supply pipe 232b is closed and the supply of $TiCl_4$ to the process chamber is stopped. Here, the APC valve 242 of the exhaust pipe 232 is left open and the interior of the process chamber 201 is exhausted by the vacuum pump 246 until the pressure is below 20 Pa, and remaining $TiCl_4$ is removed from the interior of the process chamber 201. At this time, when an inert gas such as $N_2$ is supplied into the process chamber 201, the effect of removing the remaining $TiCl_4$ may be further enhanced.

(Step 13)

In step 13, $NH_3$ is allowed to flow. $NH_3$ is allowed to flow through the gas supply pipe 232c, and a carrier gas ($N_2$) is allowed to flow through the carrier gas supply pipe 232a connected to the gas supply pipe 232c. All of the valve 310c of the gas supply pipe 232c, the valve 310a of the carrier gas supply pipe 232a, and the APC valve 242 of the exhaust pipe 231 are opened. The carrier gas flows from the carrier gas supply pipe 232a and a flow rate thereof is adjusted by the mass flow controller 241a. $NH_3$ flows from the gas supply pipe 232c and a flow rate thereof is adjusted by the mass flow controller 241c. The flow rate-adjusted $NH_3$ is mixed with the flow rate-adjusted carrier gas. The $NH_3$ mixed with the carrier gas is supplied into the process chamber 201 from a gas supply hole of the nozzle 230c while being exhausted from the exhaust pipe 231. When $NH_3$ is allowed to flow, the APC valve 242 may be appropriately adjusted to maintain the internal pressure of the process chamber 201 within a range of 50 to 1,000 Pa, e.g., at 60 Pa. A supply flow rate of $NH_3$ controlled by the mass flow controller 241c ranges from 1 to 10 slm. A duration in which the wafer 200 is exposed to $NH_3$ ranges from 10 to 30 seconds. At this time, a temperature of the heater 206 may be a predetermined temperature ranging from 300 to 550 degrees C., or may be set to e.g., 450 degrees C.

Simultaneously, when the valve 310a is opened to flow an inert gas from the carrier gas supply pipe 232a connected in the middle of the gas supply pipe 232b, NH₃ can be prevented from flowing toward the TiCl₄ side.

By supplying NH₃, the Ti-containing layer which is chemically adsorbed onto the wafer 200, and NH₃ are surface-reacted (chemical adsorption) to form a titanium nitride film on the wafer 200.

(Step 14)

In step 14, the valve 310c of the gas supply pipe 232c is closed to stop the supply of NH₃. Also, the APC valve 242 of the exhaust pipe 231 is left open and the interior of the process chamber 201 is exhausted by the vacuum pump 246 such that the pressure is below 20 Pa, and remaining NH₃ is removed from the process chamber 201. Further, at this time, when an inert gas such as N₂ is supplied into the process chamber 201 from each of the gas supply pipe 232c as the NH₃ supply line and the gas supply pipe 232b as the TiCl₄ supply line for purging, the effect of eliminating the remaining NH₃ can be further removed.

The foregoing steps 11 to 14, as one cycle, are performed one or more times to form a titanium nitride film having a predetermined thickness on the wafer 200. In each cycle, the atmosphere formed by the Ti-containing precursor gas in step 11 and the atmosphere formed by the nitriding gas in step 13 may not be mixed within the process chamber 201, as described above.

Further, a thickness of the titanium nitride film is adjusted to range from about 1 to 5 nm by controlling the number of cycles to be performed. The titanium nitride film formed at this time has a smooth surface and is also formed as a dense continuous film.

In addition, after the titanium nitride film is formed, the titanium nitride film may be annealed by using a nitrogen-containing gas, a hydrogen-containing gas, an inert gas, or the like.

Hereinafter, annealing using NH₃ as a nitrogen-containing gas will be described.

The wafer 200 with the titanium nitride film formed thereon is exposed to the NH₃ atmosphere to modify the titanium nitride film. Specifically, NH₃ is allowed to flow through the gas supply pipe 232c and the carrier gas N₂ is allowed to flow through the carrier gas supply pipe 232a connected to the gas supply pipe 232c. All of the valve 310c of the gas supply pipe 232c, the valve 310a of the carrier gas supply pipe 232a connected to the gas supply pipe 232c, and the APC valve 242 of the exhaust pipe 231 are opened. The carrier gas flows from the carrier gas supply pipe 232a and a flow rate thereof is adjusted by the mass flow controller 241a. NH₃ flows from the gas supply pipe 232c and a flow rate thereof is adjusted by the mass flow controller 241c. The flow rate-adjusted NH₃ is mixed with the flow rate-adjusted carrier gas, and supplied into the process chamber 201 from the gas supply hole of the nozzle 230c while being exhausted from the exhaust pipe 231.

When NH₃ is allowed to flow, the APC valve 242 may be appropriately adjusted to maintain the internal pressure of the process chamber 201 within a range of 50 to 1,000 Pa, e.g., at 150 Pa. A supply flow rate of NH₃ controlled by the mass flow controller 241c ranges from 1 to 91 slm. A duration in which the wafer 200 is exposed to NH₃ ranges from 1 to 10 minutes. At this time, a temperature of the heater 206 may be a predetermined temperature ranging from 300 to 550 degrees C., or may be set to, e.g., 450 degrees C. When the temperature for the annealing process is set to be equal to the temperature for film formation, a process time may be further shortened to thereby enhance throughput. Simultaneously, when the valve 310a is opened to flow an inert gas from the carrier gas supply pipe 232a connected in the middle of the gas supply pipe 232b, NH₃ can be prevented from flowing toward the TiCl₄ side.

By supplying NH₃, chloride (Cl) remaining in the film can be effectively removed, which in turn promotes a high quality film. When NH₃ is used, H and Cl of NH₃ may be combined to remove HCl.

Further, after the titanium nitride film is formed through the alternate supply method, the titanium nitride film may be plasma-processed by using a nitrogen-containing gas, a hydrogen-containing gas, an inert gas, or the like. For example, NH₃ as a nitrogen-containing gas may be activated with plasma (plasma excitation) and allowed to flow to generate a reactant having a higher level of energy. Such modification may be made by using the reactant to obtain an effect such as enhancement of device characteristics. Further, when NH₃ is activated with heat and supplied, a soft reaction can be made, and thus, the foregoing modification may be performed softly.

Also, the annealing and the plasma processing mentioned above may be simultaneously performed. That is, while setting the heater 206 to the temperature used for the annealing described above, for example, NH₃ may be activated with plasma and allowed to flow, thereby processing the titanium nitride film. In this case, a duration in which NH₃ is activated by thermal energy by setting the heater 206 to the temperature equal to that used for the annealing may not be equal to a duration in which NH₃ is activated by plasma.

Further, a gas used for at least one of the annealing and the plasma processing may be a nitrogen-containing gas, a hydrogen-containing gas, an inert gas, or the like. For example, N₂, NH₃, or monomethyl hydrazine (CH₆N₂), or the like may be used as the nitrogen-containing gas, H₂, or the like may be used as the hydrogen-containing gas, and argon (Ar), helium (He), or the like may be used as the inert gas. In some examples, the use of N₂ and NH₃ may be efficient. For example, since N₂ and NH₃ may be used for the film forming process, there is no need to newly install a mechanism for supplying a gas.

Figure 4A:
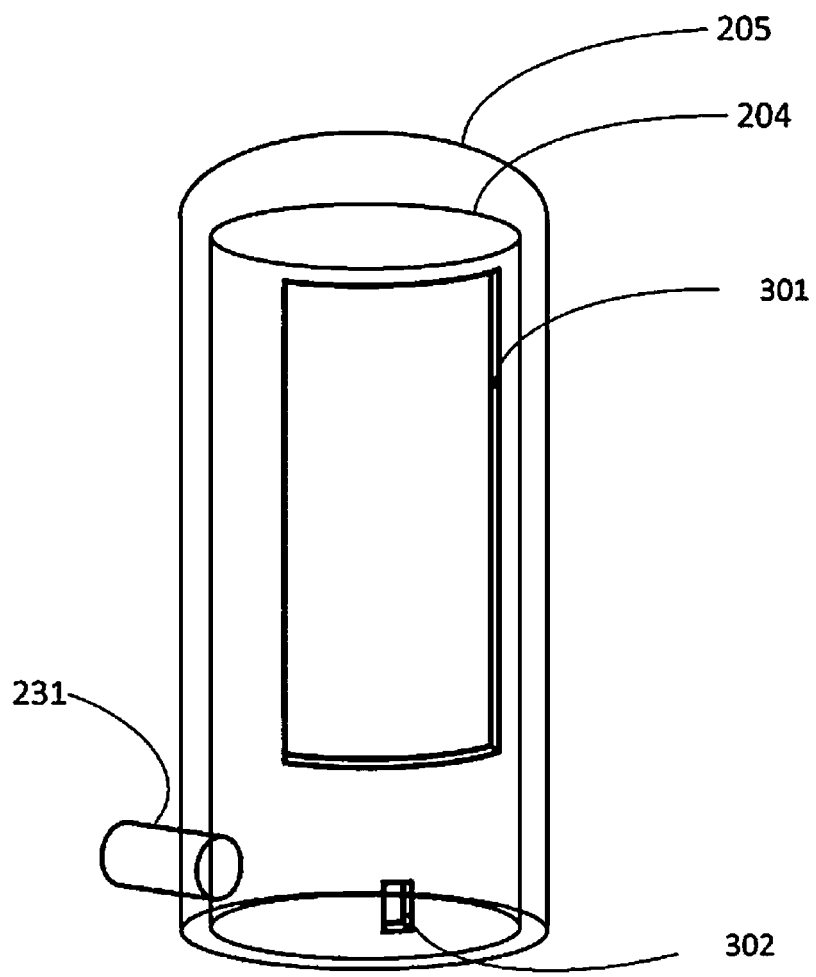
FIG. 4A is a perspective view illustrating a reaction tube including an inner tube and an outer tube in an embodiment of the present disclosure.
Figure 4B:
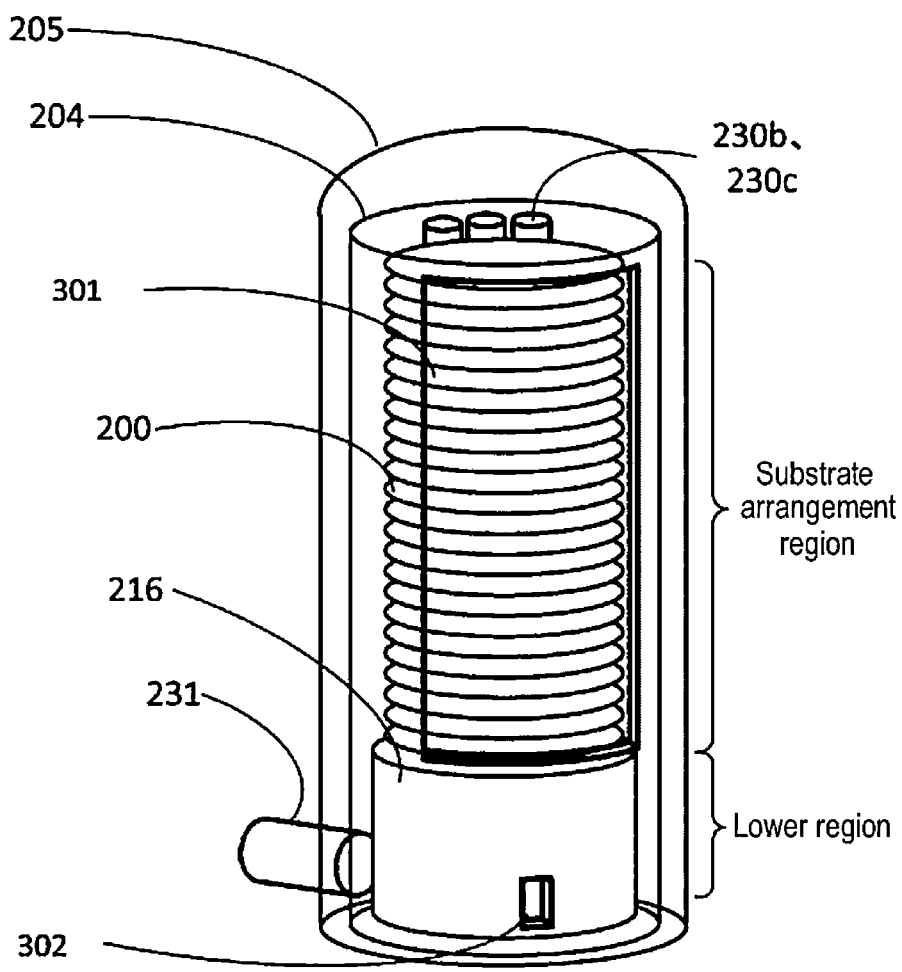
FIG. 4B is a view illustrating a reaction tube having nozzles, wafers, and an insulator installed in the reaction tube of FIG. 4A.
Figure 5:
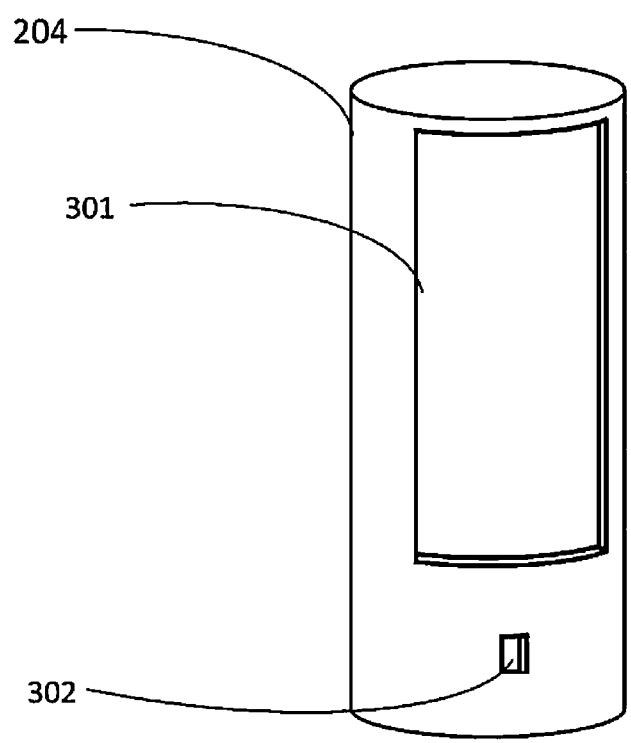
FIG. 5 is a perspective view of the inner tube according to an embodiment of the present disclosure.

Hereinafter, the processing furnace of the substrate processing apparatus in accordance with some embodiments of the present disclosure will be described in more detail with reference to FIGS. 4A, 4B and 5. FIG. 4A is a view illustrating a reaction tube including an inner tube and an outer tube in an embodiment of the present disclosure, and FIG. 4B is a view illustrating a reaction tube formed by installing nozzles, wafers, and an insulator in the reaction tube of FIG. 4A. FIG. 5 is a perspective view of the inner tube 204. In the present disclosure, the process tube 203 includes an inner tube 204 and an outer tube 205. The inner tube 204 has a first slit 301 opened in a heightwise direction of the region in which the substrates are arranged and a second slit 302 opened in a lower region of the substrate arrangement region (e.g., the region in which an insulating plates 216 is loaded). For example, a central opening angle of the opening of the first slit 301 ranges from 60 to 90°. The second slit 302 has an opening area smaller than the first slit 301. Shown in FIGS. 4A, 4B and 5, the opening of the second slit 302 has a rectangular shape, but it may have a circular shape or a polygonal shape.

Figure 6:
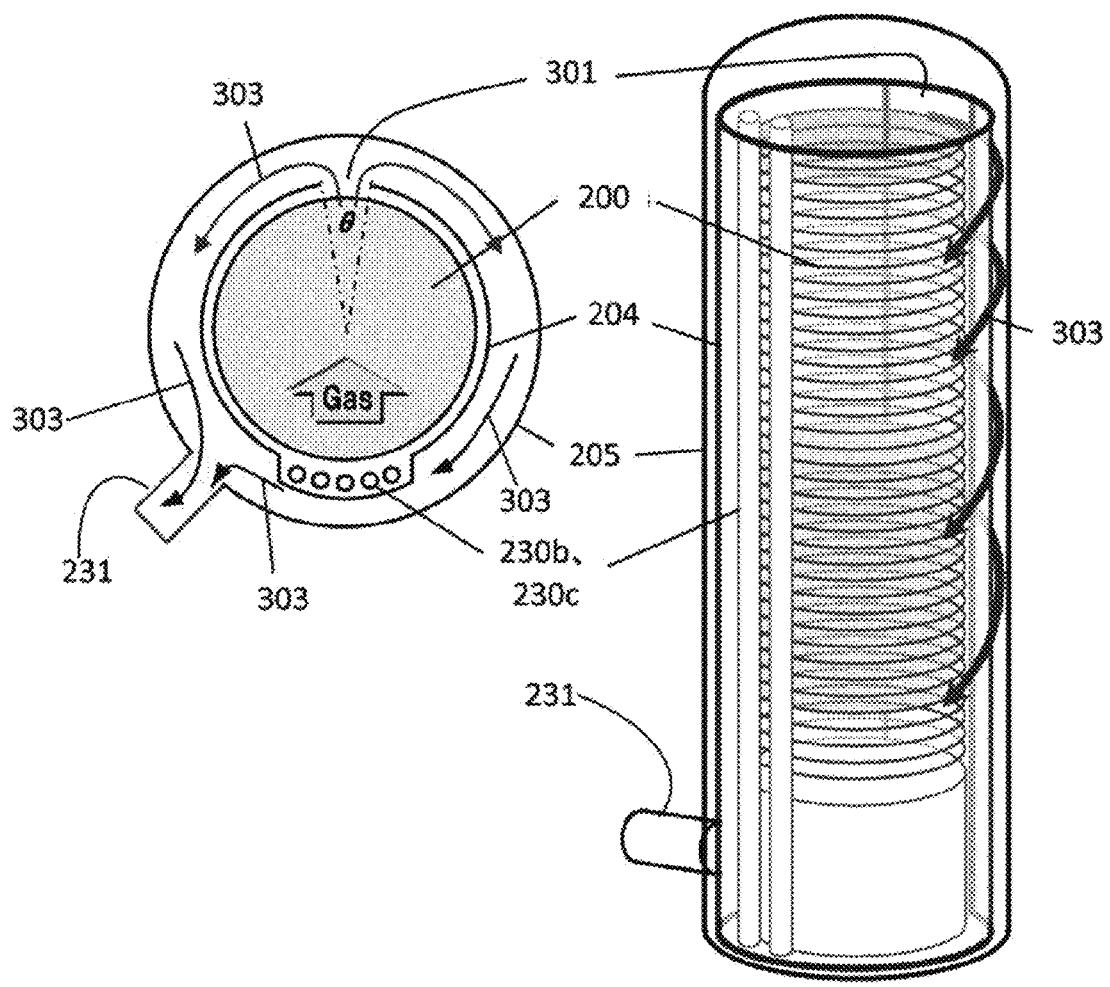
FIG. 6 is a view illustrating the way in which a process gas is exhausted from an exhaust pipe through a slit according to an embodiment of the present disclosure.

FIG. 6 is a view illustrating the way in which various gases supplied into the process chamber 201 are exhausted from the exhaust pipe 231 through the first slit 301. Various gases supplied from the nozzles 230b and 230c, or the like pass through between the plurality of stacked wafers 200 and are exhausted to the outside of the inner tube 204 from the first slit 301 (e.g., the first slit 301 has an opening angle θ ranging from 60 to 90°). A process gas 303 exhausted from the inner tube 204 passes between the inner tube 204 and the outer tube 205, and turns around along the outer wall of the inner tube 204 and the inner wall of the outer tube 205 so as to be exhausted from the processing furnace through the exhaust pipe 231. At this time, however, not all of the process gases pass between the wafers 200 and are exhausted to the outside of the inner tube 204 from the first slit 301. A portion of the process gas may not smoothly pass through between the wafers 200 and flow to drop, particularly in a downward direction of the inner tube 204 from the wide gap between the wafers 200 at the nozzle side and the inner tube 204.

The strength with which the gas flows to drop is increased as the gap between the wafers 200 and the inner tube 204 becomes narrower. In the case in which only a single slit is formed and the single slit is a straight slit formed from an upper portion to a lower portion of the inner tube 204, strength with which the supplied gas flows to drop may be the strongest. In contrast, in the case in which a slit is formed only in the substrate arrangement region or in the case in which the first slit 301 is installed in the substrate arrangement region, the second slit 302 is installed in the lower region (the insulating region), and the second slit 302 is completely closed (full closing), the strength with which the supplied gas flows to drop tends to be weakened.

However, in the case in which the second slit 302 is fully closed, since an inert gas for protecting the rotational shaft 255 from a gas is supplied from a gas supply nozzle (not shown) to the insulating region (rotational shaft purging), the inert gas is exhausted from the lower portion of the first slit 301. Thus, the inert gas used for the purpose of rotational shaft purging and the precursor gas during the substrate processing are mixed, and as a result, a precursor gas concentration of the wafers loaded in the lower region of the substrate arrangement region is disadvantageously lowered. Therefore, in order to restrain the strength with which the gas flows to drop, the second slit 302 may be fully closed, but in the case of the full closing, a purge gas of the rotational shaft may be affected. Thus, in some embodiments of the present disclosure, the second slit 302 may be slightly open.

Figure 7:
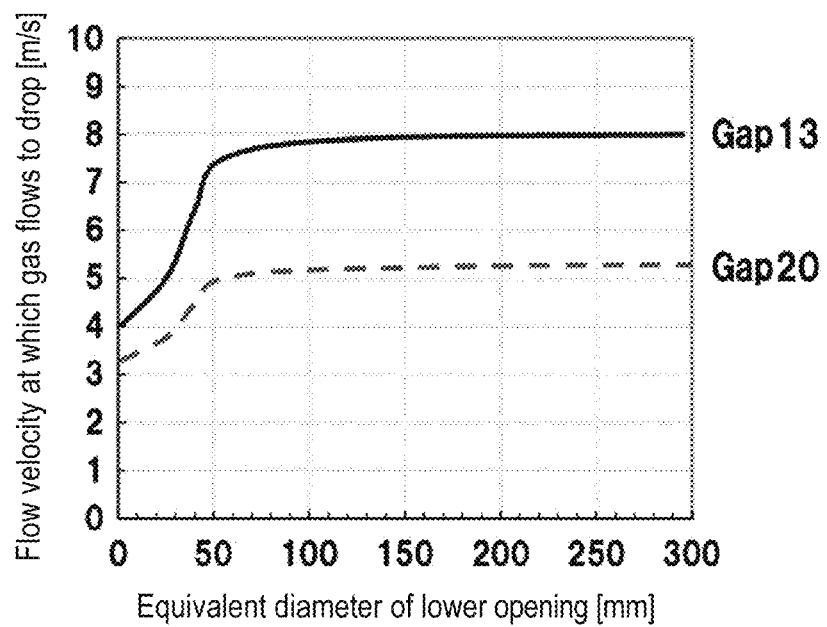
FIG. 7 is a view illustrating a relationship between a flow velocity of a gas that flows to drop and a lower opening according to an embodiment of the present disclosure.

A relationship between a flow velocity of the gas that flows to drop and an equivalent diameter (slit opening area equivalent to the area of a circle having a certain diameter) of the second slit 302 (lower opening) is illustrated in FIG. 7. Referring to FIG. 7, it can be seen that, when gaps (distances between a circumferential portion of the semiconductor wafer and the inner wall of the reaction tube) are set to 13 mm and 20 mm, the flow velocity of the gas that flows to drop in the narrower gap of 13 mm is faster. Also, in both cases of the gap of 13 mm and the gap of 20 mm, the flow velocity at which the gas flows to drop has a near upper limit value when the equivalent diameter of the lower opening (the second slit 302) is about 50 mm. In light of the above, the flow velocity at which a gas flows to drop may have an upper limit value, regardless of the size of the gap, when the equivalent diameter of the lower opening (the second slit 302) has a certain size. In other words, the flow velocity at which a gas flows to drop may reach an upper limit value when the lower opening has a certain area.

In this manner, the first slit 301 is formed in the region of the lateral surface of the inner tube 204 in which the substrates are arranged. Further, the second slit 302 having an opening area smaller than that of the first slit 301 is formed in the lower region. The insulator is arranged in the lower region which corresponds to the lower side of the first slit 301. With this structure, the efficiency of supplying a raw material to the wafers can be improved and the uniformity of film thicknesses, film quality, and electrical characteristics can be enhanced. Further, since the precursor gas is prevented from being stagnant in the lower region, the inert gas used in the rotational shaft purging can also be effectively exhausted to the outside of the processing furnace.

Further, a thickness of the titanium nitride film formed through the alternate supply method may be adjusted to about 1 to 5 nm by controlling the number of cycles to be performed. In this case, the titanium nitride film may have a smooth surface and is formed as a dense continuous film.

Also, after the titanium nitride film is formed through the alternate supply method, the titanium nitride film may be annealed or plasma-processed by using an inert gas such as argon (Ar) or helium (He).

Also, the titanium nitride film may be annealed or plasma-processed by using a gas containing a nitrogen atom, such as $N_2$, $NH_3$, or monomethylhydrazine ($CH_6N_2$).

Also, the titanium nitride film may be annealed or plasma-processed by using a gas containing a hydrogen atom, such as $H_2$.

According to the present disclosure, the titanium nitride film having a smooth, dense surface and low resistivity can be formed at a higher speed at a substrate temperature of, e.g., 450 degrees C.

Further, since a high quality thin film can be formed at a low temperature, a thermal budget can be reduced.

In addition, the films formed through the alternate supply method, for example, the stacked films including both an extremely thin stacked film on a laminate having a different composition, such as a titanium nitride film and an aluminum nitride film, and a thin film having the same composition as that of at least one of laminate films, may have high quality and high productivity.

Further, in the embodiment, the formation of the titanium nitride film using $TiCl_4$ and $NH_3$ has been described, but the present disclosure is not limited thereto and may be applied to any other types of films including $SiO_x$ film.

<Aspects of the Present Disclosure>

Hereinafter, some aspects of the present disclosure will be additionally stated as supplementary notes.

(Supplementary Note 1)

According to one aspect of the present disclosure, there is provided a reaction container for constituting a process chamber in which a plurality of substrates is processed by reacting a predetermined precursor gas therein, including:

an outer tube having a cylindrical shape with an upper end portion closed and a lower end portion opened; and an inner tube, installed within the outer tube, including a first exhaust slit and a second exhaust slit through which the predetermined precursor gas is exhausted, the first exhaust slit located in a substrate arrangement region in which the plurality of substrates are arranged, and the second exhaust slit located in a region lower than the substrate arrangement region.

(Supplementary Note 2)

According to another aspect of the present disclosure, there is provided a substrate processing apparatus, including:

a reaction tube, configured to constitute a process chamber in which a plurality of substrates is processed, including an outer tube having a cylindrical shape with an upper end portion closed and a lower end portion opened, and an inner tube, installed within the outer tube, having a first exhaust slit and a second exhaust slit through which the predetermined precursor gas is exhausted, the first exhaust slit located in a substrate arrangement region in which the plurality of substrates are arranged, and the second exhaust slit located in a region lower than the substrate arrangement region;

a process gas supply unit configured to supply a process gas into the reaction tube; and a gas exhaust unit configured to exhaust the process gas from the reaction tube.

(Supplementary Note 3)

According to another aspect of the present disclosure, there is provided a method of manufacturing a semiconductor device, including:

transferring a plurality of substrates to a reaction tube for constituting a process chamber in which the plurality of substrates is processed, and including an outer tube having a cylindrical shape with an upper end portion closed and a lower end portion opened, and an inner tube, installed within the outer tube, having a first exhaust slit and a second exhaust slit through which the predetermined precursor gas is exhausted, the first exhaust slit located in a substrate arrangement region in which the plurality of substrates are arranged, and the second exhaust slit located in a region lower than the substrate arrangement region;

supplying a predetermined process gas into the reaction tube to process the plurality of substrates; and exhausting the predetermined process gas through the first exhaust slit and the second exhaust slit.

(Supplementary Note 4)

According to another aspect of the present disclosure, there is provided a method of processing a substrate, including:

transferring a plurality of substrates to a reaction tube for constituting a process chamber in which the plurality of substrates is processed, and including an outer tube having a cylindrical shape with an upper end portion closed and a lower end portion opened, and an inner tube, installed within the outer tube, having a first exhaust slit and a second exhaust slit through which the predetermined precursor gas is exhausted, the first exhaust slit located in a substrate arrangement region in which the plurality of substrates are arranged, and the second exhaust slit located in a region lower than the substrate arrangement region;

supplying a predetermined process gas into the reaction tube to process the plurality of substrates; and exhausting the predetermined process gas through the exhaust slit installed in the inner tube.

(Supplementary Note 5)

In the reaction tube, the substrate processing apparatus, the method of manufacturing a semiconductor device, and the method of processing a substrate of any one of Supplementary Notes 1 to 4, the first exhaust slit and the second exhaust slit may be spaced from each other.

(Supplementary Note 6)

In the reaction tube, the substrate processing apparatus, the method of manufacturing a semiconductor device, and the method of processing a substrate of Supplementary Notes 1 to 5, a central opening angle of the first exhaust slit may range from 60° to 90°.

(Supplementary Note 7)

In the reaction tube, the substrate processing apparatus, the method of manufacturing a semiconductor device, and the method of processing a substrate of any one of Supplementary Notes 1 to 6, wherein the second exhaust slit may have an opening area smaller than that of the first exhaust slit.

According to the present disclosure in some embodiments, it is possible to provide a structure for a reaction tube capable of enhancing evaluation efficiency, and also uniformity of an in-plane and inter-plane film thickness, film quality, and electric characteristics of a processed substrate, while increasing efficiency of gas supply.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A reaction tube for constituting a process chamber in which a plurality of substrates is processed by reacting a predetermined precursor gas therein, comprising:
    an outer tube having a cylindrical shape with an upper end portion closed and a lower end portion opened; and
    an inner tube, installed within the outer tube, including a first exhaust slit and a second exhaust slit through which the predetermined precursor gas is exhausted, the first exhaust slit and the second exhaust slit being formed in a lateral surface of the inner tube, the first exhaust slit located in a substrate arrangement region in which the plurality of substrates are arranged, and the second exhaust slit located in an insulating region lower than the substrate arrangement region, and
    wherein the second exhaust slit has an opening area smaller than that of the first exhaust slit.

2. The reaction tube of claim 1, wherein the first exhaust slit and the second exhaust slit are spaced from each other.

3. The reaction tube of claim 1, wherein a central opening angle of the first exhaust slit ranges from 60° to 90°.

4. The reaction tube of claim 1, wherein the second exhaust slit has an equivalent diameter equal to or smaller than 50 mm.

5. A substrate processing apparatus, comprising:
    a reaction tube, configured to constitute a process chamber in which a plurality of substrates is processed, including an outer tube having a cylindrical shape with an upper end portion closed and a lower end portion opened, and an inner tube, installed within the outer tube, having a first exhaust slit and a second exhaust slit through which the predetermined precursor gas is exhausted, the first exhaust slit and the second exhaust slit being formed in a lateral surface of the inner tube, the first exhaust slit located in a substrate arrangement region in which the plurality of substrates are arranged, and the second exhaust slit located in an insulating region lower than the substrate arrangement region;
    a process gas supply unit configured to supply a process gas into the reaction tube; and
    a gas exhaust unit configured to exhaust the process gas from the reaction tube, and
    wherein the second exhaust slit has an opening area smaller than that of the first exhaust slit.

6. The substrate processing apparatus of claim 5, wherein the first exhaust slit and the second exhaust slit are spaced from each other.

7. The substrate processing apparatus of claim 5, wherein a central opening angle of the first exhaust slit ranges from 60° to 90°.

8. The substrate processing apparatus of claim 5, wherein the second exhaust slit has an equivalent diameter equal to or smaller than 50 mm.

9. The substrate processing apparatus of claim 6, further comprising an inert gas supply unit configured to supply an inert gas toward a rotational shaft configured to rotate a substrate sustaining member for sustaining and arranging the plurality of substrates.

10. A method of manufacturing a semiconductor device, comprising:

transferring a plurality of substrates to a reaction tube for constituting a process chamber in which the plurality of substrates is processed, and including an outer tube having a cylindrical shape with an upper end portion closed and a lower end portion opened, and an inner tube, installed within the outer tube, having a first exhaust slit and a second exhaust slit through which the predetermined precursor gas is exhausted, the first exhaust slit and the second exhaust slit being formed in a lateral surface of the inner tube, the first exhaust slit located in a substrate arrangement region in which the plurality of substrates are arranged, and the second exhaust slit located in an insulating region lower than the substrate arrangement region;

supplying a predetermined process gas into the reaction tube to process the plurality of substrates; and exhausting the predetermined process gas through the first exhaust slit and the second exhaust slit, and wherein the second exhaust slit has an opening area smaller than that of the first exhaust slit.

11. The method of claim 10, wherein the first exhaust slit and the second exhaust slit are spaced from each other.

12. The method of claim 10, wherein a central opening angle of the first exhaust slit ranges from 60° to 90°.

13. The method of claim 10, wherein the second exhaust slit has an equivalent diameter equal to or smaller than 50 mm.

14. The method of claim 11, further comprising supplying an inert gas toward a rotational shaft configured to rotate a substrate sustaining member for sustaining and arranging the plurality of substrates.

* * * * *